US012775347B2

(12) United States Patent
You et al.

(10) Patent No.: US 12,775,347 B2
(45) Date of Patent: Oct. 27, 2026

(54) TOUCH PANEL AND METHOD FOR MANUFACTURING THE SAME, AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventors: Weiguo You, Wuhan (CN); Liang Ma, Wuhan (CN); Shengrong Yu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 218 days.

(21) Appl. No.: 18/247,550

(22) PCT Filed: Mar. 29, 2023

(86) PCT No.: PCT/CN2023/084655
§ 371 (c)(1),
(2) Date: Sep. 22, 2025

(87) PCT Pub. No.: WO2024/178769
PCT Pub. Date: Sep. 6, 2024

(65) Prior Publication Data

US 2026/0010248 A1 Jan. 8, 2026

(30) Foreign Application Priority Data

Feb. 28, 2023 (CN) ......................... 202310195815.9

(51) Int. Cl.
*G06F 3/041* (2006.01)
*H10K 59/12* (2023.01)
(Continued)

(52) U.S. Cl.
CPC ....... *G06F 3/0412* (2013.01); *H10K 59/1201* (2023.02); *H10K 59/131* (2023.02);
(Continued)

(58) Field of Classification Search
None
See application file for complete search history.

(56) References Cited

U.S. PATENT DOCUMENTS

2018/0309079 A1* 10/2018 Matsumoto ........... G06F 1/1637
2021/0336213 A1* 10/2021 Yan ...................... H10K 59/122

FOREIGN PATENT DOCUMENTS

CN 114141836 A 3/2022
CN 114489388 A 5/2022
(Continued)

OTHER PUBLICATIONS

International Search Report in International application No. PCT/CN2023/084655, mailed on Oct. 22, 2023.
(Continued)

*Primary Examiner* — Stephen T. Reed
(74) *Attorney, Agent, or Firm* — PV IP PC; Peter Stecher; Wei Te Chung

(57) ABSTRACT

The present disclosure provides a touch panel and a method for manufacturing the same, and an electronic device. The touch panel includes a display area and a non-display area. The non-display area includes a bending area and a wire-switching area. By disposing an edge of the inorganic layer between the display area and the wire-switching area, disposing an edge of the encapsulation layer between an edge of the inorganic layer and the bending area, and disposing a
(Continued)

plurality of wire-switching holes in the wire-switching area, so that signal traces are exposed by the wire-switching holes, thus preventing materials of the encapsulation layer from remaining in the wire-switching holes.

20 Claims, 7 Drawing Sheets

(51) Int. Cl.

| | |
|---|---|
| ***H10K 59/131*** | (2023.01) |
| ***H10K 59/80*** | (2023.01) |
| ***H10K 102/00*** | (2023.01) |

(52) U.S. Cl.

CPC . *H10K 59/873* (2023.02); *G06F 2203/04102* (2013.01); *G06F 2203/04103* (2013.01); *H10K 2102/311* (2023.02); *H10K 2102/351* (2023.02)

(56) References Cited

FOREIGN PATENT DOCUMENTS

| | | | |
|---|---|---|---|
| CN | 216980613 | U | 7/2022 |
| CN | 114975829 | A | 8/2022 |
| CN | 115513261 | A | 12/2022 |

OTHER PUBLICATIONS

Written Opinion of the International Search Authority in International application No. PCT/CN2023/084655, mailed on Oct. 22, 2023.

Chinese Office Action issued in corresponding Chinese Patent Application No. 202310195815.9 dated Oct. 23, 2024, pp. 1-6.

* cited by examiner

TOUCH PANEL AND METHOD FOR MANUFACTURING THE SAME, AND ELECTRONIC DEVICE

TECHNICAL FIELD

The present disclosure relates to a technical field of display, and in particular, to a touch panel and a method for manufacturing the same, and an electronic device.

BACKGROUND

In an organic light-emitting diode (OLED) of a display device, a touch panel provides a touch-based user interface that enables a user to intuitively and conveniently input data or instructions directly to a device, rather than using a conventional input system, such as a button, a keyboard, or a mouse. Therefore, a touch panel touch must be able to sense a touch performed by a user and accurately determine touch coordinates. A touch panel (TP) is mainly composed of a sensor, a controller and a software, and is used to sense contact signals, and analyze and identify them. Touch panels may be divided into four types: resistive type, capacitive type, optical type, and sound wave type according to the different sensing technologies. Currently, a capacitive touch panel is mostly used in an OLED display panel on the market, and a capacitance change generated by electrostatic combination of a finger and a sensing unit is used to detect an induced coordinate.

Conventional touch panels adopt an add-on structure in which a transparent film containing a touch sensor is adhered to a device with a transparent adhesive, which is generally relatively thick. With the development of technology, a direct on touch (DOT) structure has gradually replaced the add-on structure as the most popular technology at present. The DOT refers to embedding a touch panel into a film above a substrate, and it is common at present to prepare a touch layer above an encapsulation layer. Compared with the add-on touch structure, the DOT structure is thinner and has higher transmittance, and can be applied to flexible display panels.

SUMMARY OF INVENTION

Technical Problem

As shown in FIG. 1, during the film formation of an inorganic encapsulation layer in an encapsulation layer, film thickness of chemical vapor deposition (CVD) will gradually decrease along the border, and this area where the film thickness is decreased is referred to as chemical vapor deposition shadow (CVD Shadow). The wireframes shown in FIG. 1 include display area AA, chemical vapor deposition border A1, and chemical vapor deposition shadow border A2. At present, the touch panel is gradually developing to a narrow frame. In a lower frame area of the touch panel, inorganic materials in the chemical vapor deposition shadow will remain in a wire-switching hole CH where signal traces lap with a touch layer, which will cause a touch driver chip to fail to transmit signals to a touch sensor, thereby affecting touch performance of a touch panel. If distance between the chemical vapor deposition border A1 and the wire-switching hole CH is increased, the encapsulation effective area of the encapsulation layer will be reduced, resulting in a risk of encapsulation failure of the touch panel. Therefore, it is necessary to provide a touch panel and method for manufacturing the same, and an electronic device to improve this defect.

Technical Solutions

Examples of the present disclosure provide a touch panel and a method for manufacturing the same, and an electronic device, which not only can reduce a width of a lower frame of a touch panel, but also can improve encapsulation effect of a touch panel.

Examples of the present disclosure provide a touch panel, which includes a display area, a bending area disposed at one side of the display area, and a wire-switching area disposed between the display area and the bending area, wherein the touch panel further includes a substrate, and a signal trace layer, an encapsulation layer, an inorganic layer and a touch layer that are sequentially stacked on the substrate, a signal trace is disposed in the signal trace layer, at least one barrier wall is disposed between the signal trace layer and the encapsulation layer, and the barrier wall is located between the display area and the wire-switching area;

wherein an edge of the inorganic layer close to the bending area is disposed between the barrier wall and the wire-switching area, an edge of the encapsulation layer close to the bending area is disposed between the edge of the inorganic layer close to the bending area and the bending area, more than one wire-switching hole is disposed in the wire-switching area to expose the signal trace, and the touch layer passes through the wire-switching holes and laps with the signal trace.

According to an example of the present disclosure, the encapsulation layer is disposed in the wire-switching area, and the signal trace is exposed from the encapsulation layer.

According to an example of the present disclosure, the signal trace layer includes a planarization layer disposed on one side of the signal trace layer away from the substrate, and the encapsulation layer is disposed on one side of the planarization layer away from the substrate; and wherein the wire-switching hole includes a first opening penetrating through the planarization layer and a second opening penetrating through the encapsulation layer, and the second opening is connected to the first opening.

According to an example of the present disclosure, an orthographic projection of the second opening on the substrate falls within an orthographic projection of the first opening on the substrate.

According to an example of the present disclosure, the encapsulation layer covers sidewalls of the first opening.

According to an example of the present disclosure, the encapsulation layer includes a first inorganic encapsulation layer and a second inorganic encapsulation layer disposed on the first inorganic encapsulation layer;

- wherein an edge of the second inorganic encapsulation layer close to the wire-switching area is disposed between the edge of the inorganic layer close to the wire-switching area and the wire-switching area, an edge of the first inorganic encapsulation layer close to the bending area is disposed between the wire-switching area and the bending area, and the second opening in formed in the first inorganic encapsulation layer.

According to an example of the present disclosure, the first inorganic encapsulation layer and the second inorganic encapsulation layer overlap in the display area and an area between the display area and the edge of the second inorganic encapsulation layer close to the wire-switching area, and the first inorganic encapsulation layer and the second inorganic encapsulation layer do not overlap in an area between the edge of the second inorganic encapsulation layer close to the wire-switching area and the edge of the first inorganic encapsulation layer close to the bending area; and wherein a thickness of the first inorganic encapsulation layer overlapping with the second inorganic encapsulation layer is greater than a thickness of the first inorganic encapsulation layer not overlapping with the second inorganic encapsulation layer.

According to an example of the present disclosure, the edge of the inorganic layer close to the wire-switching area is formed with a first step protruding on a surface of the second inorganic encapsulation layer, and the edge of the second inorganic encapsulation layer close to the wire-switching area is formed with a second step protruding on a surface of the first inorganic encapsulation layer; and wherein the first step is disposed between the barrier wall and the wire-switching area, the second step is disposed between the first step and the wire-switching area, and a distance between the second step and the first step is greater than or equal to 20 microns and less than or equal to 30 microns.

According to an example of the present disclosure, wherein the signal trace layer includes a planarization layer disposed on one side of the signal trace layer away from the substrate, and the encapsulation layer is disposed on one side of the planarization layer away from the substrate; and wherein the wire-switching hole penetrates through the planarization layer, and the edge of the encapsulation layer close to the wire-switching area is disposed between the edge of the inorganic layer close to the wire-switching area and the wire-switching area.

According to an example of the present disclosure, the encapsulation layer includes a first inorganic encapsulation layer and a second inorganic encapsulation layer disposed on the first inorganic encapsulation layer; and wherein an edge of the second inorganic encapsulation layer close to the wire-switching area is disposed between the edge of the inorganic layer close to the wire-switching area and the wire-switching area, and an edge of the first inorganic encapsulation layer close to the wire-switching area is disposed between the edge of the second inorganic encapsulation layer close to the wire-switching and the wire-switching area.

According to an example of the present disclosure, wherein the first inorganic encapsulation layer and the second inorganic encapsulation layer overlap in the display area and an area between the display area and the edge of the second inorganic encapsulation layer close to the wire-switching area, and the first inorganic encapsulation layer and the second inorganic encapsulation layer do not overlap in an area between the edge of the second inorganic encapsulation layer close to the wire-switching area and the edge of the first inorganic encapsulation layer close to the wire-switching area; and wherein a thickness of the first inorganic encapsulation layer overlapping with the second inorganic encapsulation layer is greater than a thickness of the first inorganic encapsulation layer not overlapping with the second inorganic encapsulation layer.

According to an example of the present disclosure, the edge of the inorganic layer close to the wire-switching area is formed with a first step protruding on a surface of the second inorganic encapsulation layer, the edge of the second inorganic encapsulation layer close to the wire-switching area is formed with a second step protruding on a surface of the first inorganic encapsulation layer, and the edge of the first inorganic encapsulation layer close to the bending area is formed with a third step protruding on a surface of the planarization layer; and wherein the first step is disposed between the barrier wall and the wire-switching area, the second step is disposed between the first step and the wire-switching area, the third step is disposed between the second step and the third step, a distance between the second step and the first step is greater than or equal to 20 microns and less than or equal to 30 microns, and a distance between the third step and the second step is greater than or equal to 20 microns and less than or equal to 30 microns.

According to the touch panel provided in the above examples of the present disclosure, an example of the present disclosure further provides a method for manufacturing a touch panel, which is used for manufacturing the above touch panel, wherein the touch panel includes a display area, a bending area disposed on one side of the display area, and a wire-switching area disposed between the display area and the bending area, and the method includes:

sequentially forming a signal trace layer, at least one barrier wall, an encapsulation layer and an inorganic layer on a substrate, both the encapsulation layer and the inorganic layer covering the display area, the wire-switching area and the bending area, and the barrier wall being formed between the display area and the wire-switching area;

etching the inorganic layer so that an edge of the inorganic layer close to the bending area is retracted between the barrier wall and the wire-switching area;

etching the encapsulation layer so that an edge of the encapsulation layer close to the wire-switching area is retracted between an edge of the inorganic layer and the bending area to expose a signal trace in the signal trace layer; and forming a touch layer on the inorganic layer and the encapsulation layer, and the touch layer being lapping with the signal trace.

According to the touch panel provided in the above examples of the present disclosure, an example of the present disclosure further provides an electronic device comprising a touch panel, wherein the touch panel includes a display area, a bending area disposed on one side of the display area, and a wire-switching area disposed between the display area and the bending area, and the touch panel further includes a substrate, and a signal trace layer, an encapsulation layer, an inorganic layer and a touch layer that are sequentially stacked on the substrate, a signal trace is disposed in the signal trace layer, at least one barrier wall is disposed between the signal trace layer and the encapsulation layer, and the barrier wall is located between the display area and the wire-switching area; and wherein an edge of the inorganic layer close to the bending area is disposed between the barrier wall and the wire-switching area, an edge of the encapsulation layer close to the bending area is disposed between the edge of the inorganic layer close to the bending area and the bending area, more than one wire-switching hole is disposed in the wire-switching area to expose the signal trace, and the touch layer passes through the wire-switching holes and laps with the signal trace.

According to an example of the present disclosure, the encapsulation layer is disposed in the wire-switching area, and the signal trace is exposed from the encapsulation layer.

According to an example of the present disclosure, the signal trace layer includes a planarization layer disposed on one side of the signal trace layer away from the substrate, and the encapsulation layer is disposed on one side of the planarization layer away from the substrate; and wherein the wire-switching hole includes a first opening penetrating through the planarization layer and a second opening penetrating through the encapsulation layer, and the second opening is connected to the first opening.

According to an example of the present disclosure, an orthographic projection of the second opening on the substrate falls within an orthographic projection of the first opening on the substrate.

According to an example of the present disclosure, the encapsulation layer covers sidewalls of the first opening.

According to an example of the present disclosure, the encapsulation layer includes a first inorganic encapsulation layer and a second inorganic encapsulation layer disposed on the first inorganic encapsulation layer;

wherein an edge of the second inorganic encapsulation layer close to the wire-switching area is disposed between the edge of the inorganic layer close to the bending area and the wire-switching area, an edge of the first inorganic encapsulation layer close to the bending area is disposed between the wire-switching area and the bending area, and the second opening penetrates through the first inorganic encapsulation layer.

According to an example of the present disclosure, the first inorganic encapsulation layer and the second inorganic encapsulation layer overlap in the display area and an area between the display area and the edge of the second inorganic encapsulation layer close to the wire-switching area, and the first inorganic encapsulation layer and the second inorganic encapsulation layer do not overlap in an area between the edge of the second inorganic encapsulation layer close to the wire-switching area and the edge of the first inorganic encapsulation layer close to the bending area; and wherein a thickness of the first inorganic encapsulation layer overlapping with the second inorganic encapsulation layer is greater than a thickness of the first inorganic encapsulation layer not overlapping with the second inorganic encapsulation layer.

Technical Effects

Advantageous effects of examples of the present disclosure are as follows: examples of the present disclosure provide a touch panel and a method for manufacturing the same. The touch panel includes a display area, a bending area disposed on one side of the display area, and a wire-switching area disposed between the display area and the bending area. The touch panel further includes a substrate, and a signal trace layer, an encapsulation layer, an inorganic layer and a touch layer that are sequentially stacked on the substrate. A signal trace is disposed in the signal trace layer. By disposing an edge of the inorganic layer close to the bending area between the barrier wall and the wire-switching area, disposing an edge of the encapsulation layer close to the bending area between an edge of the inorganic layer and the bending area, and disposing a plurality of wire-switching holes in the wire-switching area, so that signal traces are exposed by the wire-switching holes, thus preventing materials of the encapsulation layer from remaining in the wire-switching holes, ensuring that the touch layer can pass through the wire-switching holes and lap with the signal traces, reducing the width of the lower frame of the touch panel, and improving encapsulation effect of the touch panel.

BRIEF DESCRIPTION OF THE DRAWINGS

In order to more clearly describe the technical solutions in examples of the present disclosure, hereinafter, the appended drawings used for describing the examples will be briefly introduced. Apparently, the appended drawings described below are only directed to some examples of the present disclosure, and for a person skilled in the art, without expenditure of creative labor, other drawings can be derived on the basis of these appended drawings.

DETAILED DESCRIPTION

Figure 1:
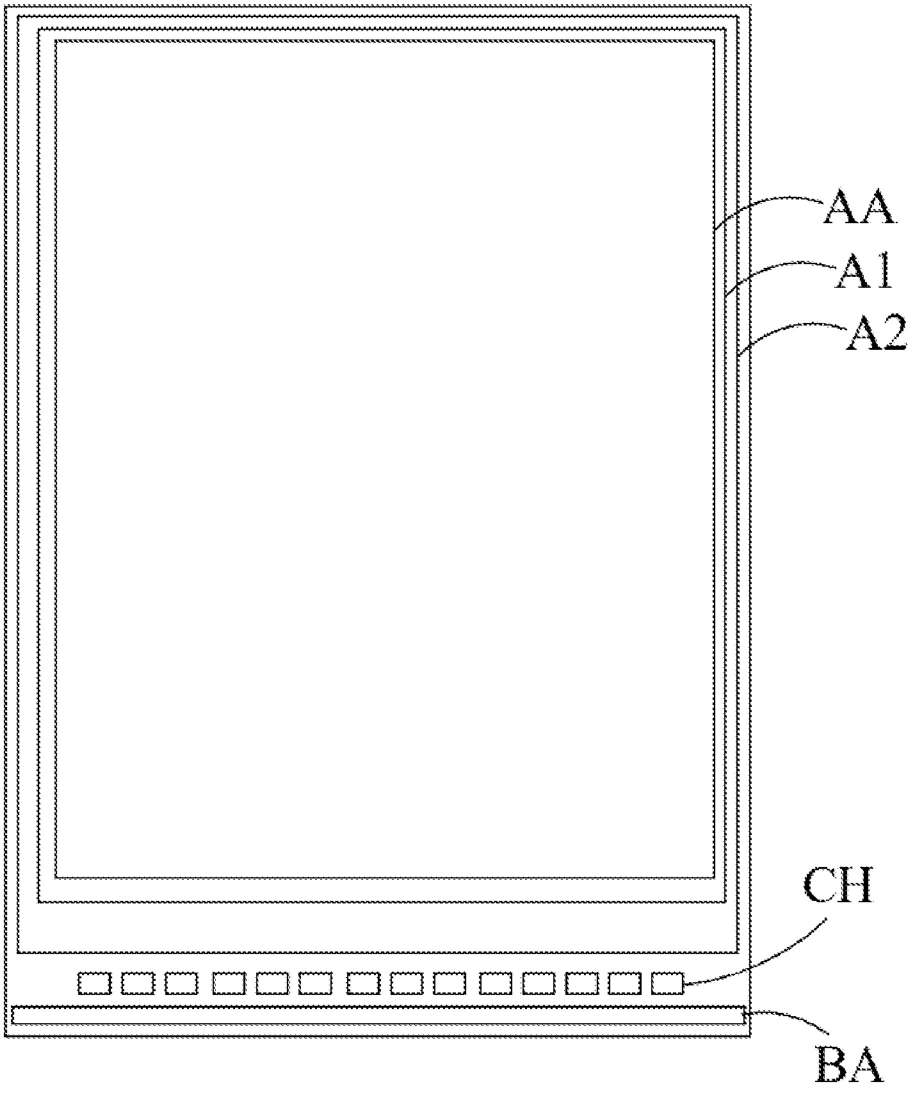
FIG. 1 is a schematic plan view of a touch panel in related arts.

The following description of the various examples is provided with reference to the accompanying drawings to illustrate the specific examples of the present disclosure. Directional terms mentioned in the present disclosure, such as “upper”, “lower”, “front”, “back”, “left”, “right”, “inside”, “outside”, “side”, etc., only refer to the direction of the additional drawing. Therefore, the directional terms used are for the purpose of illustration and understanding of the present disclosure. In the drawings, units with similar structures are indicated by the same reference numerals.

Hereinafter, technical solutions in examples of the present disclosure will be further described with reference to the accompanying drawings and specific examples.

Examples of the present disclosure provide a touch panel and a method for manufacturing the same. The touch panel includes a display area, a bending area disposed on one side of the display area, and a wire-switching area disposed between the display area and the bending area. The touch panel further includes a substrate, and a signal trace layer, an encapsulation layer, an inorganic layer and a touch layer which are sequentially stacked on the substrate. A signal trace is disposed in the signal trace layer. By disposing an edge of the inorganic layer close to the bending area between the barrier wall and the wire-switching area, disposing an edge of the encapsulation layer close to the bending area between an edge of the inorganic layer and the bending area, and disposing a plurality of wire-switching holes in the wire-switching area, so that signal traces are exposed by the wire-switching holes, thus preventing materials of the encapsulation layer from remaining in the wire-switching holes, ensuring that the touch layer can pass through the wire-switching holes and lap with the signal traces, reducing the width of the lower frame of the touch panel, and improving encapsulation effect of the touch panel.

Figure 2:
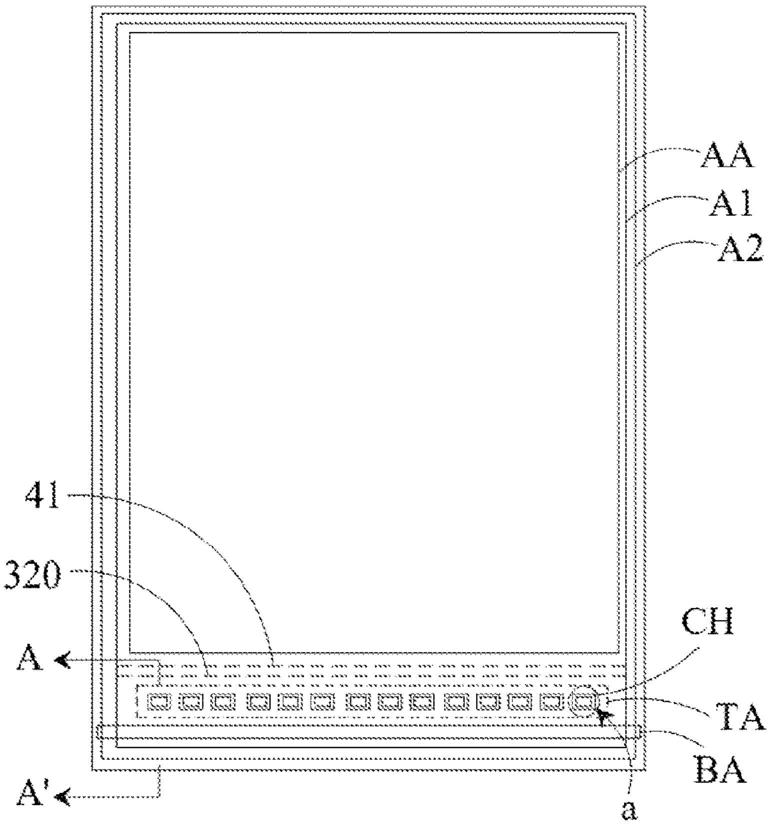
FIG. 2 is a schematic plan view of a touch panel according to a first example of the present disclosure.

With respect to FIG. 2, a schematic plan view of a touch panel according to a first example of the present disclosure. The touch panel provided by examples of the present disclosure includes a display area AA for displaying an image and a non-display area disposed around the display area AA.

The non-display area includes a bending area BA disposed on one side of the display area AA and a wire-switching area TA disposed between the display area AA and the bending area BA.

In example of the present disclosure, both the wire-switching area TA and the bending area BA are disposed at a lower frame of the touch panel. There is a certain spacing between the wire-switching area TA and a lower edge of the display area AA, and there is a certain spacing between the bending area BA and the wire-switching area TA.

FIG. 2 shows a state in which a lower frame of the touch panel is not bent, and the lower frame of the touch panel can be bent in the bending area BA, so that the portion of the lower frame of the touch panel below the bending area BA can be bent to the back of the touch panel, thereby reducing the width of the lower frame of the touch panel.

Figure 3:
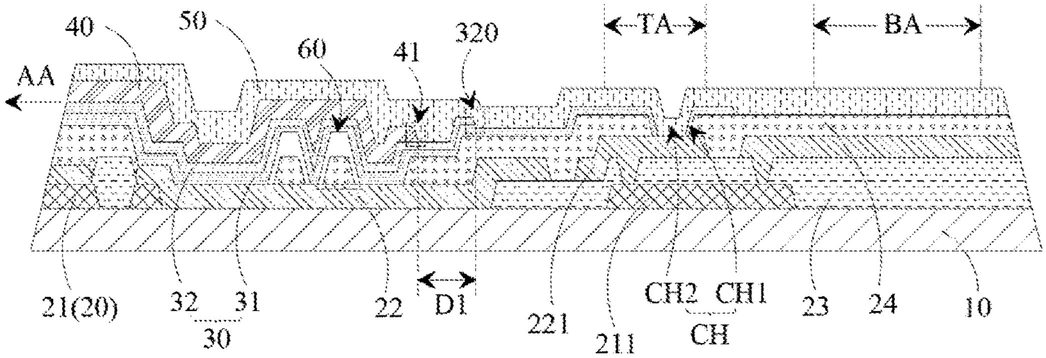
FIG. 3 is a cross-sectional schematic view of a touch panel shown in FIG. 2 along the direction A-A'.

With respect to FIG. 3, a cross-sectional schematic view of a touch panel shown in FIG. 2 along the direction A-A'. The touch panel further comprises a substrate 10, and a signal trace layer 20, an encapsulation layer 30, an inorganic layer 40 and a touch layer 50 which are sequentially stacked on the substrate 10. At least one barrier wall 60 is disposed between the signal trace layer 20 and the encapsulation layer 30, and the barrier wall 60 is located between the display area AA and the wire-switching area TA.

It should be noted that FIG. 3 is a cross-sectional view of a touch panel in a non-display area. The touch panel provided in examples of the present disclosure is an organic light-emitting diode display panel. Since both an organic light-emitting diode and a pixel driving circuit are provided in the display area AA, film structure of the organic light-emitting diode and the pixel driving circuit are not shown in FIG. 3.

In examples of the present disclosure, a plurality of signal traces may be disposed in the signal trace layer 20, and the signal traces may be covered by an upper planarization layer or other insulating layer.

A plurality of wire-switching holes CH are provided in the wire-switching area TA, and the wire-switching holes CH can penetrate through the planarization layer or other insulating layers covered above the signal traces in a thickness direction of the touch panel, and expose the signal traces. The touch layer 50 passes through the wire-switching holes CH and laps with the signal traces. The signal traces are electrically connected to the touch layer 50 and a touch driving chip, respectively, to transmit touch signals output from the touch drive chip to the touch layer 50.

In examples of the present disclosure, the non-display area of the touch panel further includes a binding area, which can be disposed on one side of the bending area BA away from the display area AA. A plurality of metal pads can be disposed in the binding area, and both the touch driving chip and a display driving chip can be bound to the binding area through the metal pads.

It should be noted that FIGS. 1 to 6 the specification of the present disclosure all show a state in which the bending area BA of the touch panel is not bent, but not the final product form of the touch panel provided in examples of the present disclosure. The final product form of the touch panel provided in examples of the present disclosure should be that each film in the bending area BA is bent from the front of the touch panel to the back of the touch panel, and each film in the binding area, and the touch driving chip and the display driving chip located on the binding area can be bent to the back of the touch panel together with the bending area BA.

In examples of the present disclosure, touch type of the touch panel may be any one of self-capacitance touch and mutual-capacitance touch, which is not limited herein. The touch layer 50 may include one or two or more metal layers, and an insulating layer disposed between adjacent metal layers. In practical applications, specific film structure of the touch layer 50 can refer to an existing touch panel, which will not be described herein.

Further, an edge of the inorganic layer 40 close to the bending area BA is disposed between the display area AA and the wire-switching area TA. An edge of the encapsulation layer 30 close to the bending area BA is disposed between an edge of the inorganic layer 40 and the bending area BA.

In an example, a part of the encapsulation layer 30 is disposed in the wire-switching area TA to expose the signal traces.

As shown in FIG. 3, both the display area AA and an area between the display area AA and the bending area BA are provided with an encapsulation layer 30, that is, the wire-switching area TA is also provided with an encapsulation layer 30. An edge of the encapsulation layer 30 close to the bending area BA is located in the wire-switching area TA or between the wire-switching area TA and the bending area BA, but does not extend into the bending area BA.

Both the display area AA and an area between the display area AA and the line switching area TA are provided with an inorganic layer 40, which is formed on a surface of the encapsulation layer 30 away from the substrate 10. An edge of the inorganic layer 40 close to the bending area BA is located in the area between the display area AA and the line switching area TA, but does not extend into the wire-switching area TA, so that a part of the encapsulation layer 30 located in the area between the display area AA and the wire-switching area TA, and the encapsulation layer 30 located in the wire-switching area TA can be exposed. An edge of the inorganic layer 40 close to the bending area BA is formed with a first step 41 protruding on a surface of the second inorganic encapsulation layer 32, and the first step 41 is disposed between the barrier wall 60 and the wire-switching area TA.

In the wire-switching area TA, a planarization layer is disposed on one side of the signal traces away from the substrate 10. The encapsulation layer 30 is disposed on one side of the planarization layer away from the substrate 10. The wire-switching holes CH penetrate through the planarization layer 30 and the planarization layer between the encapsulation layer 30 and the signal traces in a thickness direction of the touch panel, and expose the signal traces below the planarization layer. The touch layer 50 is formed on one side of the encapsulation layer 30 away from the substrate 10, passes through the wire-switching holes CH, and laps with the signal traces.

Further, a wire-switching hole CH may include a first opening CH1 penetrating through the planarization layer in the thickness direction of the touch panel and a second opening CH2 penetrating through the encapsulation layer 30 in the thickness direction of the touch panel, and the second opening CH2 is connected to the first opening CH1.

As shown in FIG. 3, the signal trace layer 20 includes a first signal trace layer 21 disposed above the substrate 10, a second signal trace layer 22 disposed on one side of the first signal trace layer 21 away from the substrate 10, a first planarization layer 23 disposed on one side of the first signal trace layer 21 away from the substrate 10, and a second planarization layer 24 disposed on one side of the second signal trace layer 22 away from the substrate 10.

It should be noted that the first signal trace layer 21 is disposed on the substrate 10 may means that the first signal wiring layer 21 is disposed on the substrate 10 and is in direct contact with a surface of the substrate 10. It may also mean that the first signal trace layer 21 is located above the substrate 10, and is separated from the substrate 10 by an inorganic film such as an insulating layer, a barrier layer, a buffer layer, or another organic film. In an example of the present disclosure, the first signal trace layer 21 is located above the substrate 10 and is separated from the substrate 10 by an inorganic insulating layer.

As shown in FIG. 3, in examples of the present disclosure, the signal trace may include a first signal trace 211 disposed in the first signal trace layer 21 and a second signal trace 221 disposed in the second signal trace layer 22, and the first signal trace 211 may lap with second signal trace 221 through a via hole penetrating through the first planarization layer 23. It should be noted that FIG. 3 only illustrates the positional relationship and the connection relationship between the signal trace in the signal wiring layer and the touch layer. The film structure of the signal trace layer shown in FIG. 3 does not represent the film structure of the signal trace layer in practical application, which may be disposed according to actual situations, so it is not limited herein.

In an example, the first signal trace layer 21 may be disposed in the same layer as a first source-drain metal layer of the pixel driving circuit in the display area. The first source-drain metal layer may be provided with a source, a drain and a data signal wire. The second signal trace layer 22 may be disposed in the same layer as a second source-drain metal layer of the pixel driving circuit in the display area. The second source-drain metal layer may be provided with a power supply signal wire, a lap electrode for lapping the source or drain with an anode.

The encapsulation layer 30 includes a first inorganic encapsulation layer 31 and a second inorganic encapsulation layer 32 disposed on the first inorganic encapsulation layer 31. The encapsulation layer 30 may also include an organic encapsulation layer, which may be disposed between the first inorganic encapsulation layer 31 and the second inorganic encapsulation layer 32. It should be noted that the organic encapsulation layer is disposed only in the display area AA and an area close to the display area AA in the non-display area, therefore the organic encapsulation layer is not illustrated in FIG. 3.

The barrier wall 60 may be composed of a first sub-layer and a second sub-layer disposed on the first sub-layer, wherein the first sub-layer may be prepared from the same material and the same film-forming process as the second planarization layer 24, and the second sub-layer may be prepared from the same material and the same film-forming process as a pixel definition layer. The barrier wall 60 is disposed between the display area AA and the wire-switching area TA, and can completely or partially surround the display area AA.

In this example, as shown in FIG. 3, two barrier walls 60 are disposed between the display area AA and the wire-switching area TA, and they are disposed layer by layer around the display area AA. The first inorganic encapsulation layer 31 and the second inorganic encapsulation layer 32 are sequentially covered on the barrier walls 60. The barrier walls 60 can prevent the organic encapsulation layer in the encapsulation layer 30 from overflowing to an area outside the barrier walls 60. In practical application, the number of the barrier walls 60 in the touch panel is not limited to only two in this example, but also can be one or more. The number of the barrier walls 60 may be disposed according to actual requirements, which is not limited herein.

Specifically, as shown in FIG. 3, both the display area AA and an area between the display area AA and the bending area BA are provided with a first inorganic encapsulation layer 31. A second inorganic encapsulation layer 32 is formed in the display area AA and an area between the display area AA and the wire-switching area TA, and an edge of the second inorganic encapsulation layer 32 close to the wire-switching area TA is disposed between an edge of the inorganic layer 40 close to the wire-switching area TA and the wire-switching area TA. An edge of the first inorganic encapsulation layer 31 close to the bending area BA may be disposed in the wire-switching area TA or between the wire-switching area TA and the wire-switching area BA. An edge of the second inorganic encapsulation layer 32 close to the wire-switching area TA is formed with a second step 320 protruding on a surface of the first inorganic encapsulation layer 31, and the second step 320 is disposed between the first step 41 and the wire-switching area TA.

In an example, a distance D1 between the first step 41 and the second step 320 is greater than or equal to 20 microns and less than or equal to 30 microns.

Specifically, the distance D1 between the first step 41 and the second step 320 may be, but is not limited to, any one of 20 microns, 23 microns, 25 microns, 27 microns, or 30 microns. In practical application, the distance D1 between the first step 41 and the second step 320 may be any value between 20 microns and 30 microns, whose uniqueness is not limited herein.

It should be noted that if the distance between the first step 41 and the second step 320 is too small, the first step 41 and the second step 320 may be stacked together, causing a great stacking height of the first step 41 and the second step 320, thus resulting in problem that metal films deposited inside the touch layer 50 on the first step 41 and the second step 320 are prone to break. The distance between the first step 41 and the second step 320 is limited to range from 20 microns to 30 microns, so as to reduce the risk of breakage of the metal films inside the touch layer 50 at the first step 41 or the second step 320.

As shown in FIG. 3, in this example, an edge of the first inorganic encapsulation layer 31 close to the bending area BA is disposed between the wire-switching area TA and the bending area BA. In the wire-switching area TA, the first inorganic encapsulation layer 31 covers other parts of the second planarization layer 24 except the wire-switching holes CH. The first opening CH1 penetrates through the second planarization layer 24 in the thickness direction of the touch panel, the second opening CH2 through the first inorganic encapsulation layer 31 in the thickness direction of the touch panel, and the first opening CH1 is connected to the second opening CH2 to expose the second signal trace 221.

It should be noted that since the film thickness of the inorganic encapsulation layer gradually decreases along an edge of the film, the area where the film thickness decreases is referred to as chemical vapor deposition shadow, and the chemical vapor deposition shadow does not belong to an effective encapsulation area. If the border of the chemical vapor deposition is limited between the display area AA and the wire-switching area TA, the chemical vapor deposition shadow will compress the width of the effective encapsulation area, which will increase the risk of encapsulation failure. In order to ensure encapsulation effect, it is necessary to reserve a certain distance between the display area AA and the wire-switching area TA to form an effective encapsulation area with a sufficient width, but this will increase the width of the lower frame of the touch panel. In this example, an edge of the encapsulation layer is extended between the wire-switching area and the bending area, so that there is a sufficient space between the display area AA and the bending area BA to form an effective encapsulation area with an uniform thickness, so that the area of the effective encapsulation area is prevented from being compressed by the chemical vapor deposition shadow. Therefore, the width of the lower frame of the touch panel can be reduced on the basis of ensuring the encapsulation effect, and the effect of narrowing the lower frame of the touch panel can be realized. In addition, by forming a second opening CH2 penetrating through the first inorganic packaging layer 31 and connecting the second opening CH2 to the first opening CH1 to expose the signal traces, inorganic encapsulation materials of chemical vapor deposition can be prevented from remaining in the wire-switching holes.

In an example, an orthographic projection of the second opening CH2 on the substrate 10 falls within an orthographic projection of the first opening CH1 on the substrate 10.

Figure 4:
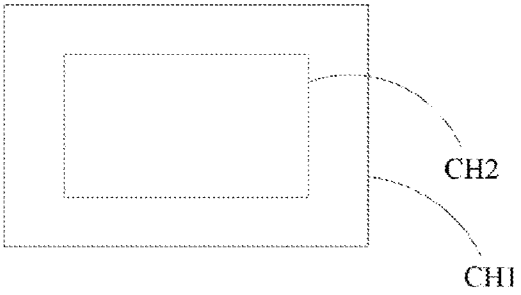
FIG. 4 is an enlarged schematic view at position a of the touch panel shown in FIG. 2.

As shown in FIG. 4, the second opening CH2 is sleeved on the first opening CH1, and the circumferential circle of the second opening CH2 has a diameter smaller than that of the circumferential circle of the first opening CH1, so that the orthographic projection of the second opening CH2 on the substrate 10 falls within the orthographic projection of the first opening CH1 on the substrate 10, and the first inorganic encapsulation layer 31 in the encapsulation layer 30 can cover sidewalls of the first opening CH1. In this configuration, the first inorganic encapsulation layer 31 may be used to cover the second planarization layer 24 exposed through the first opening CH1, so as to prevent moisture or oxygen in external environment from invading into the light-emitting device layer through the second planarization layer 24 exposed through the first opening CH1, thereby improving reliability of the touch panel.

In an example, the thickness of the first inorganic encapsulation layer 31 overlapping with the second inorganic encapsulation layer 32 is greater than the thickness of the first inorganic encapsulation layer 31 not overlapping with the second inorganic encapsulation layer 32.

As shown in FIG. 3, the first inorganic encapsulation layer 31 may be divided into two parts, one of which is located in the display area AA and an area between the display area AA and an edge of the second inorganic encapsulation layer 32 close to the wire-switching area TA, and the second inorganic encapsulation layer 32 is disposed on the first inorganic encapsulation layer 31 in this area. That is, the first inorganic encapsulation layer 31 in this area overlaps with the second inorganic encapsulation layer 32 in the thickness direction of the touch panel. The other part is located in an area between an edge of the second inorganic encapsulation layer 32 close to the wire-switching area TA and an edge of the first inorganic encapsulation layer 31 close to the bending area BA, and there is no second inorganic encapsulation layer 32 disposing on the first inorganic encapsulation layer 31 in this area. That is, the first inorganic encapsulation layer 31 in this area does not overlap with the second inorganic encapsulation layer 32 in the thickness direction of the touch panel.

It should be noted that, since sidewalls of the wire-switching holes CH are covered with the first inorganic encapsulation layer 31, but the bottom of the wire-switching holes CH is not covered with the first inorganic encapsulation layer 31, a large thickness of the first inorganic encapsulation layer 31 located in the wire-switching area TA will result in a great step difference between the bottom of the wire-switching holes CH and sidewall, thereby causing metal films deposited on the sidewalls of the wire-switching holes CH to break. In this example, the thickness of the first inorganic encapsulation layer 31 in the wire-switching area TA is thinned, so that it is smaller than the thickness of the first inorganic encapsulation layer 31 in other areas, thus avoiding the problem that metal films deposited on the sidewalls of the wire-switching holes CH in the touch layer 50 are broken due to excessive thickness of the first inorganic encapsulation layer 31 at the wire-switching holes CH.

In an example, the material of the inorganic layer 40 is silicon nitride. In practical application, the material of the inorganic layer 40 is not limited to silicon nitride in the above-described examples, but may also be an inorganic insulating material such as silicon oxide or silicon oxynitride. The materials of both the first inorganic encapsulation layer 31 and the second inorganic encapsulation layer 32 are silicon oxide. In practical application, the materials of the first inorganic encapsulation layer 31 and the second inorganic encapsulation layer 32 are not limited to the silicon oxide in the above-described examples, but may also be inorganic insulating materials such as silicon nitride or silicon oxynitride.

Figure 5:
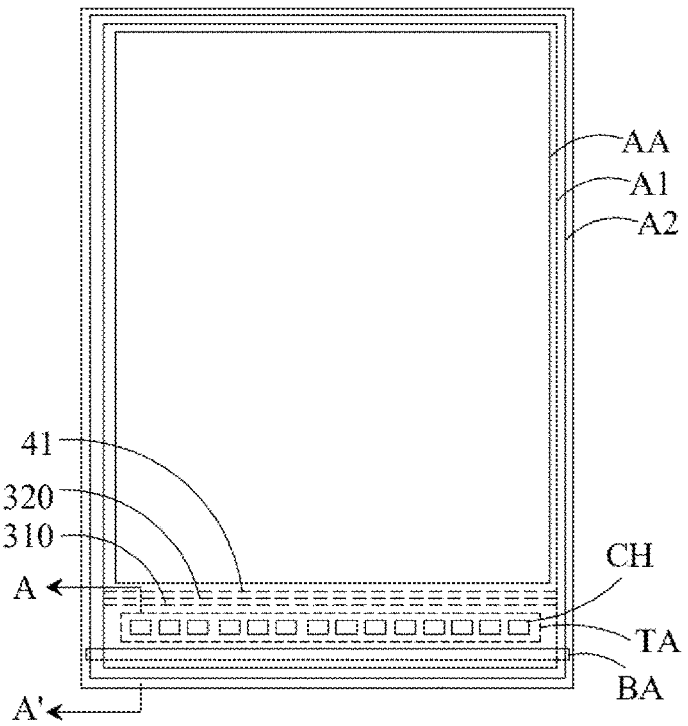
FIG. 5 is a schematic plan view of a touch panel according to a second example of the present disclosure.
Figure 6:
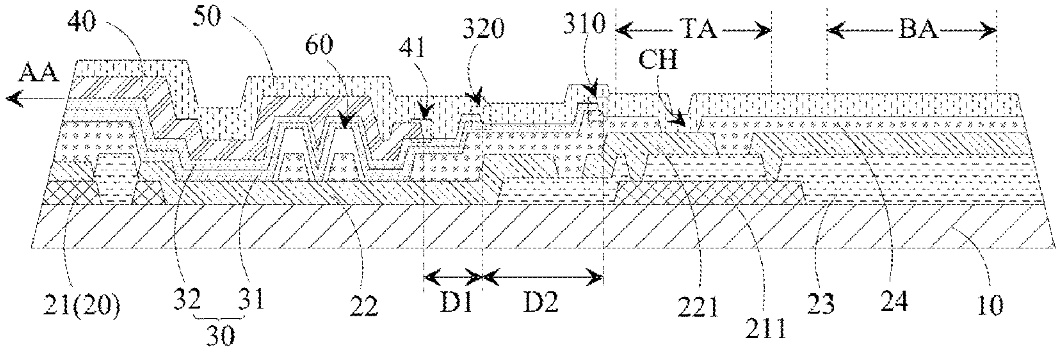
FIG. 6 is a cross-sectional schematic view of a touch panel shown in FIG. 5 along the direction A-A'.

With respect to FIGS. 5 and 6, wherein FIG. 5 is a schematic plan view of a touch panel according to a second example of the present disclosure, and FIG. 6 is a cross-sectional schematic view of a touch panel shown in FIG. 5 along the direction A-A'. The touch panel provided by the second example as shown in FIGS. 5 and 6 has a structure substantially the same as that of the touch panel provided by the first example as shown in FIGS. 2 to 4, and the difference lies in that: the first encapsulation layer 30 is not formed in the wire-switching area TA.

As shown in FIG. 6, an edge of the second inorganic encapsulation layer 32 close to the wire-switching area TA is disposed between an edge of the inorganic layer 40 close to the wire-switching area TA and the wire-switching area TA, and an edge of the first inorganic encapsulation layer 31 close to the wire-switching area TA is disposed between an edge of the second inorganic encapsulation layer 31 close to the wire-switching area TA and the wire-switching area TA. The first inorganic encapsulation layer 31 is not disposed in the wire-switching area TA. The wire-switching holes CH penetrates through the second planarization layer 24 in the thickness direction of the touch panel, and exposes the second signal trace 221. The touch layer 50 is formed on the second planarization layer 24 in the wire-switching area TA, passes through the wire-switching holes CH, and laps with the second signal trace 221.

In an example, the thickness of the first inorganic encapsulation layer 31 overlapping with the second inorganic encapsulation layer 32 is greater than the thickness of the first inorganic encapsulation layer 31 not overlapping with the second inorganic encapsulation layer 32.

As shown in FIG. 6, the first inorganic encapsulation layer 31 may be divided into two parts, one of which is located in the display area AA and an area between the display area AA and an edge of the second inorganic encapsulation layer 32 close to the wire-switching area TA, and the second inorganic encapsulation layer 32 is disposed on the first inorganic encapsulation layer 31 in this area. That is, the first inorganic encapsulation layer 31 in this area overlaps with the second inorganic encapsulation layer 32 in the thickness direction of the touch panel. The other part is located in an area between an edge of the second inorganic encapsulation layer 32 close to the wire-switching area TA and an edge of the first inorganic encapsulation layer 31 close to the bending area BA, and there is no second inorganic encapsulation layer 32 disposing on the first inorganic encapsulation layer 31 in this area. That is, the first inorganic encapsulation layer 31 in this area does not overlap with the second inorganic encapsulation layer 32 in the thickness direction of the touch panel.

The edge of the first inorganic encapsulation layer 31 close to the wire-switching area TA is formed with a third step 310 protruding on a surface of the second planarization layer 24. The height of the third step 310 can be reduced by reducing the thickness of the first inorganic encapsulation layer 31 close to the wire-switching area TA, thereby reducing the risk of breakage of metal films inside the touch layer 50 formed on the third step 310.

In an example, the distance D2 between the third step 310 and the second step 320 is greater than or equal to 20 microns and less than or equal to 30 microns.

Specifically, Specifically, the distance D2 between the third step 310 and the second step 320 may be, but is not limited to, any one of 20 microns, 23 microns, 25 microns, 27 microns, or 30 microns. In practical application, the distance D2 between the third step 310 and the second step 320 may be any value between 20 microns and 30 microns, whose uniqueness is not limited herein.

It should be noted that if the distance between the third step 310 and the second step 320 is too small, the third step 310 and the second step 320 may be stacked together, causing a great stacking height of the third step 310 and the second step 320, thus resulting in problem that metal films deposited inside the touch layer 50 on the first step 41 and the second step 320 is prone to break. The distance between the third step 310 and the second step 320 is limited to range from 20 microns to 30 microns, so as to reduce the risk of breakage of the metal films inside the touch layer 50 at the third step 310 or the second step 320.

According to the touch panel provided in the above examples of the present disclosure, an example of the present disclosure further provides a method for manufacturing a touch panel, which is used for manufacturing the above touch panel, wherein the touch panel includes a display area AA and a non-display area. The non-display area includes a bending area BA disposed on one side of the display area AA and a wire-switching area TA disposed between the display area AA and the bending area BA.

As shown in FIGS. 7*a* to 7*k*, which are flowcharts of a method for manufacturing a touch panel according to a first example of the present disclosure. The method for manufacturing a touch panel includes:

Step S10: sequentially forming a signal trace layer 20, at least one barrier wall 60, an encapsulation layer 30, and an inorganic layer 40 on a substrate 10. Both the encapsulation layer 30 and the inorganic layer 40 cover the display area AA, the wire-switching area TA and the bending area BA. The barrier wall is formed between the display area AA and the wire-switching area TA.

Figure 7A:
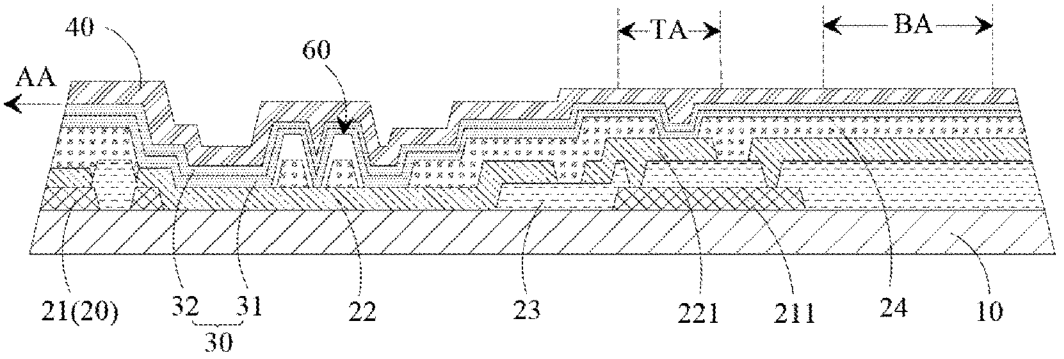
FIGS. 7*a* to 7*k* are flowcharts of a method for manufacturing a touch panel according to a first example of the present disclosure.

As shown in FIG. 7*a*, the encapsulation layer 30 and the inorganic layer 40 are formed in both the display area AA and the non-display area. The encapsulation layer 30 and the inorganic layer 40 are continuously disposed from the display area AA to the bending area BA, and it can be regarded that both the encapsulation layer 30 and the inorganic layer 40 completely cover the touch panel.

Specifically, in the step S10, the encapsulation layer 30 may be firstly deposited on the entire surface of the light-emitting device layer by chemical vapor deposition, and then the inorganic layer may be deposited on the entire surface of the encapsulation layer 30 by vapor deposition.

As shown in FIG. 2, the solid line frame A1 shown in FIG. 2 is the border of the encapsulation layer 30 formed by chemical vapor deposition in the step S10, and the solid line frame A2 is the border of the chemical vapor deposition shadow formed in the step S10. As shown in FIG. 7*a*, the signal trace layer 20 includes a first signal trace layer 21, a second signal trace layer 22, a first planarization layer 23, and a second planarization layer 24 that are sequentially stacked. The first signal trace layer 21 may include a first signal trace 211, and the second signal trace layer 22 may include a second signal trace 221.

The encapsulation layer 30 includes a first inorganic encapsulation layer 31, an organic encapsulation layer, and a second inorganic encapsulation layer 32 that are stacked in sequence, wherein the organic encapsulation layer is disposed only in the display area AA and an area close to the display area AA. FIGS. 7*a* to 7*k* only schematically illustrate the first inorganic encapsulation layer 31 and the second inorganic encapsulation layer 32.

A first opening CH1 is formed in the second planarization layer 24 to expose the second signal trace 221 before forming the encapsulation layer 30 and the inorganic layer 40.

Step S20, etching the inorganic layer 40 so that an edge of the inorganic layer 40 close to the wire-switching area TA is retracted between the barrier wall 60 and the wire-switching area TA.

Figure 7B:
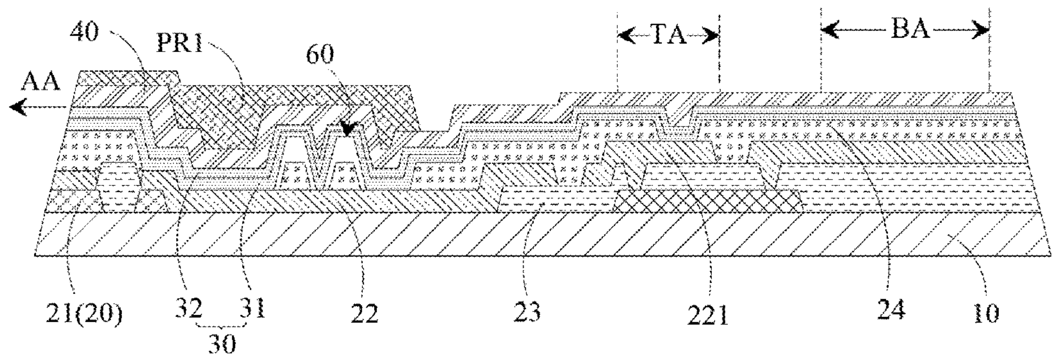

Specifically, the step S20 includes:

Step S21: as shown in FIG. 7*b*, forming a first photoresist layer on the inorganic layer 40, and exposing and developing the first photoresist layer to form a first photoresist pattern PR1, which covers other areas except the bending area BA, the wire-switching area TA, and the driving chip pads or the flexible circuit board pads.

Figure 7C:
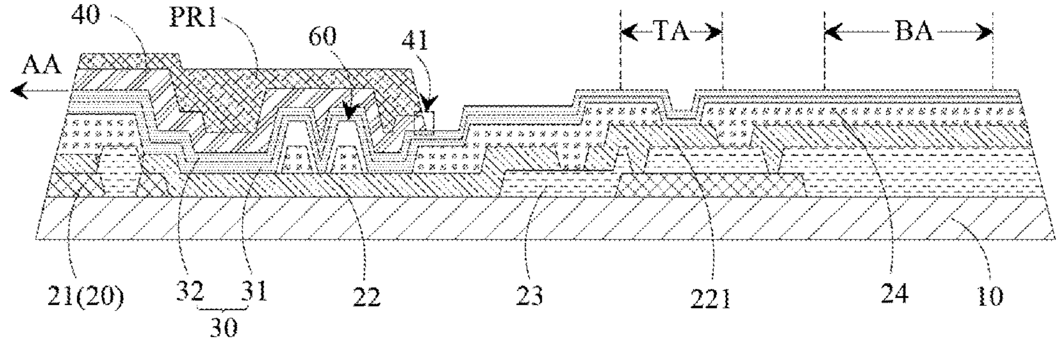
Figure 7D:
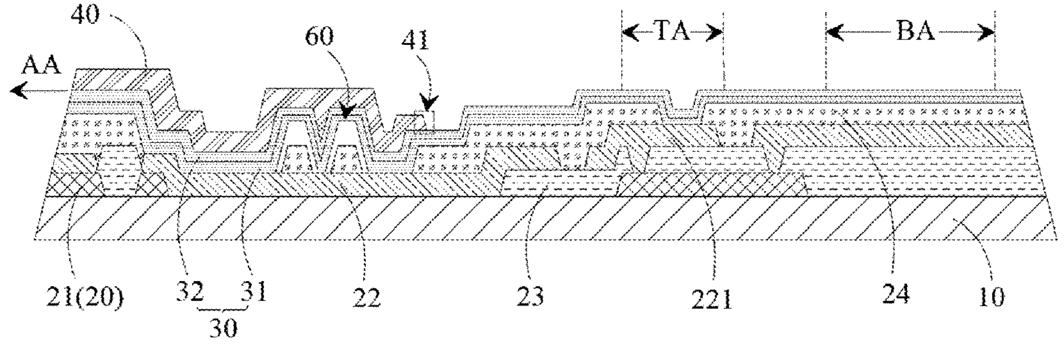

Step S22: as shown in FIG. 7*c*, etching the inorganic layer 40 to remove the inorganic layer 40 not covered by the first photoresist pattern PR1, so that the edge of the inorganic layer 40 close to the wire-switching area TA is retracted into the area between the display area AA and the wire-switching area TA, and the second inorganic encapsulation layer 32 is exposed;

Step S23, as shown in FIG. 7*d*, removing the first photoresist pattern PR1 by using a stripping solution to expose the inorganic layer 40.

In the step S22, an etching depth of the inorganic layer 40 is about 0.5 microns to 0.8 microns, and the edge of the inorganic layer 40 close to the bending area BA is formed with a first step 41 located in the area between the display area AA and the wire-switching area TA.

Step S30, the encapsulation layer 30 so that an edge of the encapsulation layer 30 close to the bending area BA is retracted between an edge of the inorganic layer 40 and the bending area BA to expose a signal trace in the signal trace layer 221.

Figure 7E:
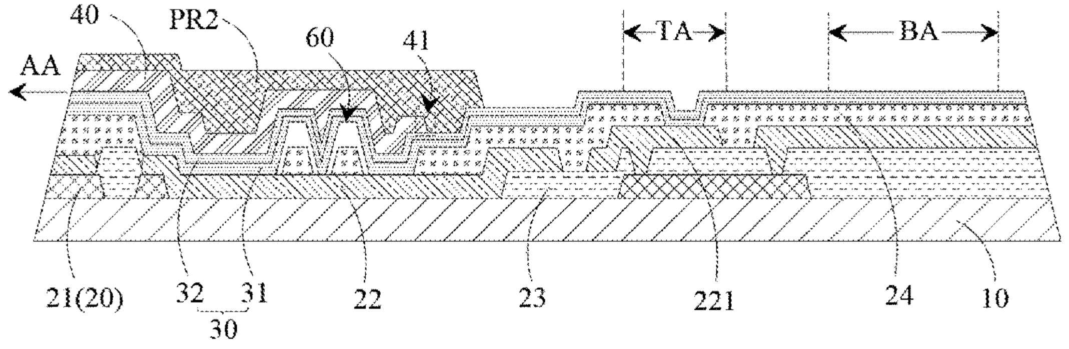

Specifically, the step S30 includes:

Step S31: as shown in FIG. 7*e*, forming a second photoresist layer on the inorganic layer 40 and the second inorganic encapsulation layer 32, and exposing and developing the second photoresist layer to form a second photoresist pattern PR2, which covers other areas except the bending area BA, the wire-switching area TA, and the driving chip pads or the flexible circuit board pads.

Figure 7F:
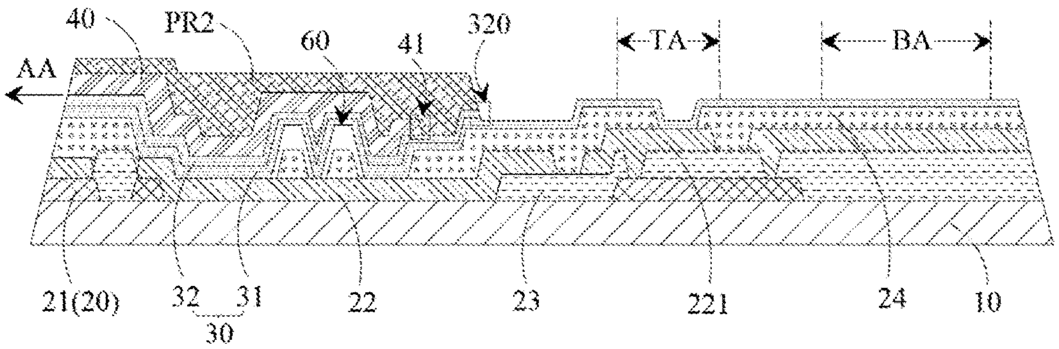

Step S32: as shown in FIG. 7*f*, etching the second inorganic encapsulation layer 32 and the first inorganic encapsulation layer 31 to remove the second inorganic encapsulation layer 32 not covered by the second photoresist pattern PR2, and thinning the first inorganic encapsulation layer 31 not covered by the second photoresist pattern PR2, so that the edge of the second inorganic encapsulation layer 32 close to the bending area BA is located between the edge of the inorganic layer 40 and the wire-switching area TA, thus forming a second step 320.

Figure 7G:
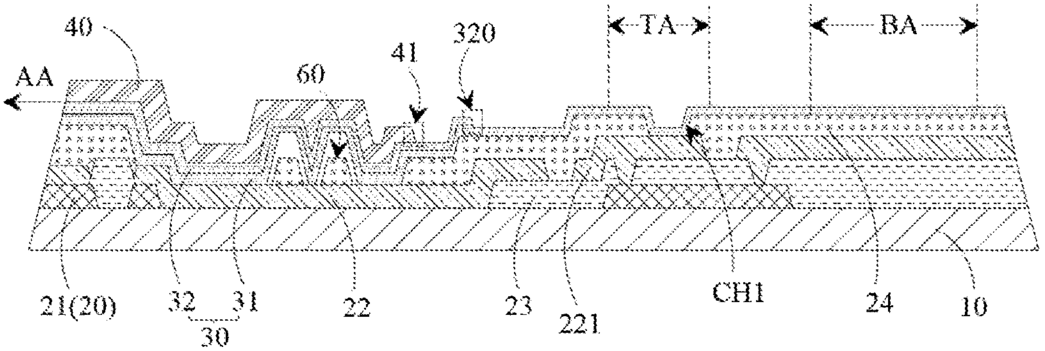

Step S33: as shown in FIG. 7*g*, removing the second photoresist pattern PR2 by using a stripping solution to expose the inorganic layer 40, the second inorganic encapsulation layer 32, and the first inorganic encapsulation layer 31.

Figure 7H:
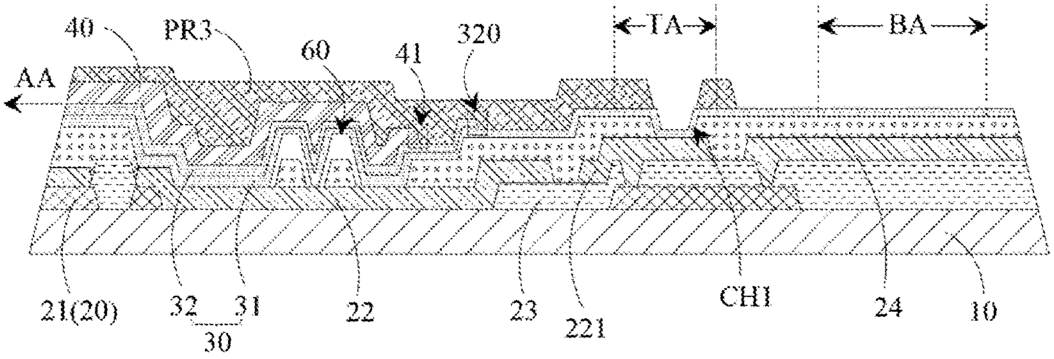

Step S34: as shown in FIG. 7*h*, forming a third photoresist layer on the inorganic layer 40, the second inorganic encapsulation layer 32, and the first inorganic encapsulation layer 31, and exposing and developing third photoresist layer to form a third photoresist pattern PR3, which covers other areas except the first opening CH1 and the bending area BA.

Figure 7I:
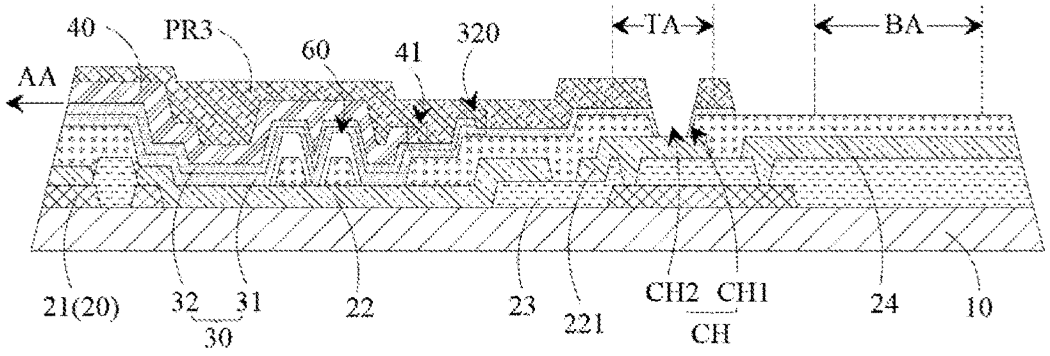

Step S35: as shown in FIG. 7*i*, etching the first inorganic encapsulation layer 31 not covered by the third photoresist pattern PR3 to form a second opening CH2 connecting to the first opening CH1 to expose the signal trace 221.

Figure 7J:
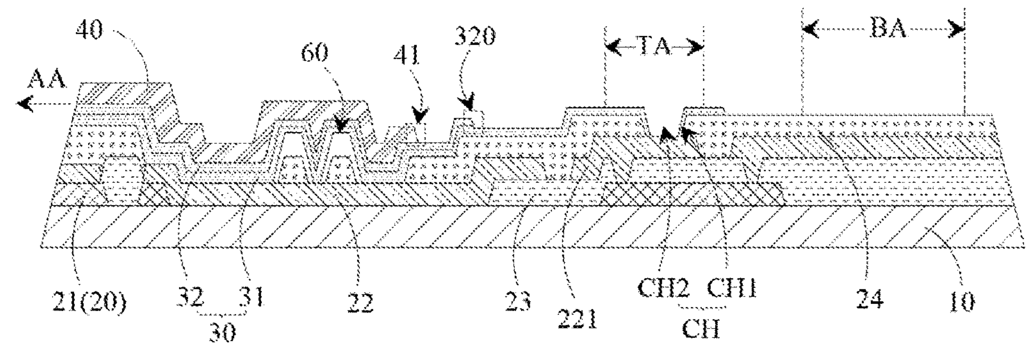

As shown in FIG. 7*j*, removing the third photoresist pattern PR3 by using a stripping solution.

In the step 31, the distance between the edge of the second photoresist pattern PR2 close to the bending area BA and the first step 41 is greater than or equal to 20 microns and less than or equal to 30 microns, so that the distance D1 between the second step 320 and the first step 41 can be maintained between 20 microns and 30 microns.

In the step S32, the total etching thickness of the encapsulation layer 30 in the step S32 is about 1.35 microns, wherein the etching thickness of the second inorganic encapsulation layer 32 is about 0.55 microns to expose the first inorganic encapsulation layer 31 below the second inorganic encapsulation layer 32. The etching thickness of the first inorganic encapsulation layer 31 is about 0.8 microns, so as to reduce the thickness of the first inorganic encapsulation layer 31, thus avoiding the problem that metal films deposited on sidewalls of the wire-switching holes CH in the touch layer 50 are broken due to excessive thickness of the first inorganic encapsulation layer 31.

Step S40: forming a touch layer 50 on the inorganic layer 40 and the encapsulation layer 30, and the touch layer 50 is lapped with the second signal trace 221.

Figure 7K:
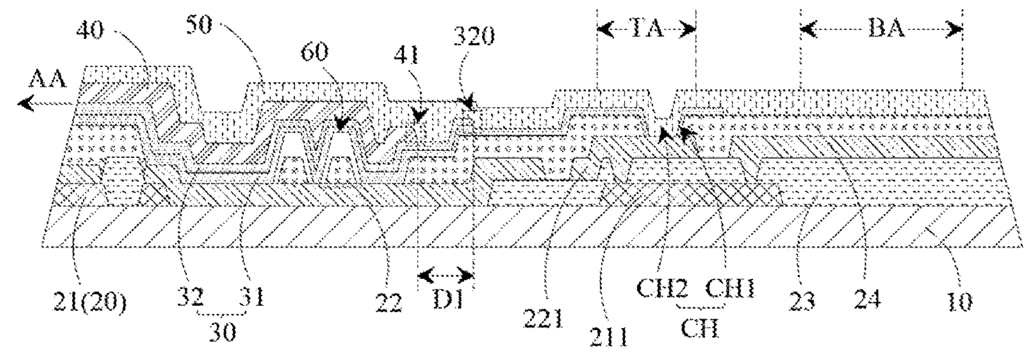

Specifically, as shown in FIG. 7*k*, the touch layer 50 may be formed on the inorganic layer 40, the second inorganic encapsulation layer 32, and the first inorganic encapsulation layer 31 by physical vapor deposition, the touch layer 50 passes through the wire-switching holes CH, and is lapped with the second signal trace 221.

It should be noted that the touch type of the touch panel 50 may be any one of self-capacitance touch and mutual-capacitance touch, which is not limited herein. The touch layer 50 may include one or two or more metal layers, and an insulating layer disposed between adjacent metal layers. In practical applications, specific film structure of the touch layer 50 can refer to an existing touch panel, which will not be described herein.

In the step S40, the etching thickness of the first inorganic encapsulation layer 31 is about 0.6 microns, so that the first inorganic encapsulation layer 31 on the bottom of the first opening CH1 can be removed to form a second opening CH2. The second opening CH2 is sleeved on the first opening CH1, and the circumferential circle of the second opening CH2 has a diameter smaller than that of the circumferential circle of the first opening CH1. In this way, the first inorganic encapsulation layer 31 located on the sidewalls of the first opening CH1 can be retained to cover the second planarization layer 24 exposed through the first opening CH1, so that moisture or oxygen in external environment can be prevented from invading into the light-emitting device layer through the second planarization layer 24 exposed through the first opening CH1, thereby improving reliability of the touch panel.

With respect to FIG. 1 and FIGS. 7*a* to 7*k*, the edge of the inorganic encapsulation layer formed by chemical vapor deposition in the related arts as shown in FIG. 1 is located between the display area AA and the wire-switching area in which the wire-switching holes CH are located. In order to ensure the encapsulation effect, a sufficient width needs to be reserved between the display area AA and the wire-switching area, so as to form an effective encapsulation area with sufficient width between the display area AA and the wire-switching area. However, it will lead to an increase in width of the lower frame of the touch panel in this case. In this example, firstly, forming an encapsulation layer covering the display area AA and the bending area BA by chemical vapor deposition, so that an effective encapsulation area with uniform thickness is formed between the display area AA and the bending area BA, which can avoid the chemical vapor deposition shadow from compressing areas of the effective encapsulation area, thereby reducing width of the lower frame of the touch panel and realizing the effect of narrow frame of the touch panel on the basis of ensuring the encapsulation effects. Then etching the second inorganic encapsulation layer 32 and the first inorganic encapsulation layer 31 in the encapsulation layer 30, so that the edges of them are retracted towards the wire-switching area TA. Meanwhile, etching the first inorganic encapsulation layer 31 to form a second opening CH2 connecting to the first opening CH2 to expose the signal traces, thus avoiding the inorganic encapsulation material remaining in the wire-switching holes CH.

Figure 8A:
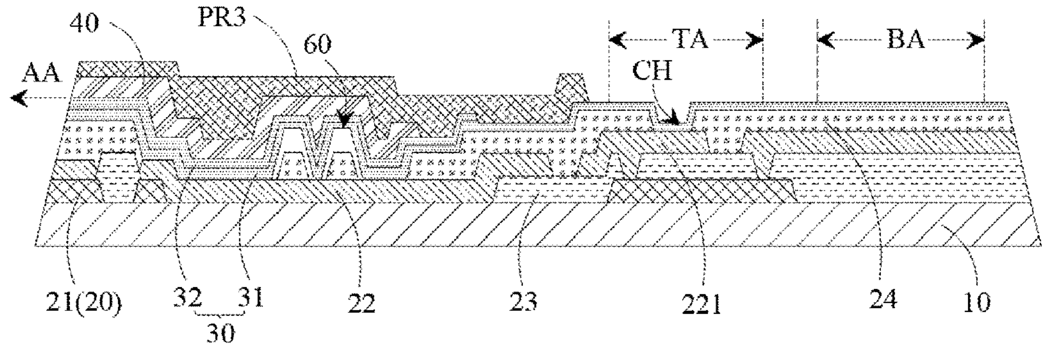
FIGS. 8*a* to 8*d* are schematic flowcharts of a method for manufacturing a touch panel according to a second example of the present disclosure.

With respect to FIG. 8*a* to FIG. 8*d*, schematic flowcharts of a method for manufacturing a touch panel according to a second example of the present disclosure. Steps S10, S20 and S33 in step S30 of the method for manufacturing a touch panel according to the second example are the same as those according to the first example, which are not described in details herein. The method for manufacturing a touch panel according to the second example differs from that according to the first example in that:

Step S34: as shown in FIG. 8*a*, forming a third photoresist layer on the inorganic layer 40, the second inorganic encapsulation layer 32, and the first inorganic encapsulation layer 31, and exposing and developing the third photoresist layer to form a third photoresist pattern PR3, which covers other areas except the wire-switching area TA and the bending area BA.

Figure 8B:
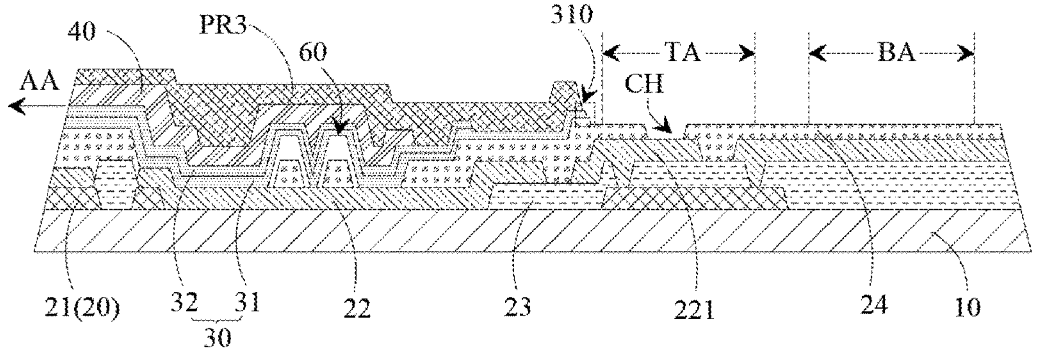

Step S35, as shown in FIG. 8*b*, etching the first inorganic encapsulation layer 31 not covered by the third photoresist pattern PR3, so that the edge of the first inorganic encapsulation layer 31 close to the bending area BA is retracted between the edge of the second inorganic encapsulation layer 32 and the wire-switching area TA; a third step 310 in the area is formed between the display area AA and the wire-switching area TA; and the second planarization layer 24 in the wire-switching area TA, the wire-switching holes CH formed in the second planarization layer 24, and the second signal traces 221 are exposed.

Figure 8C:
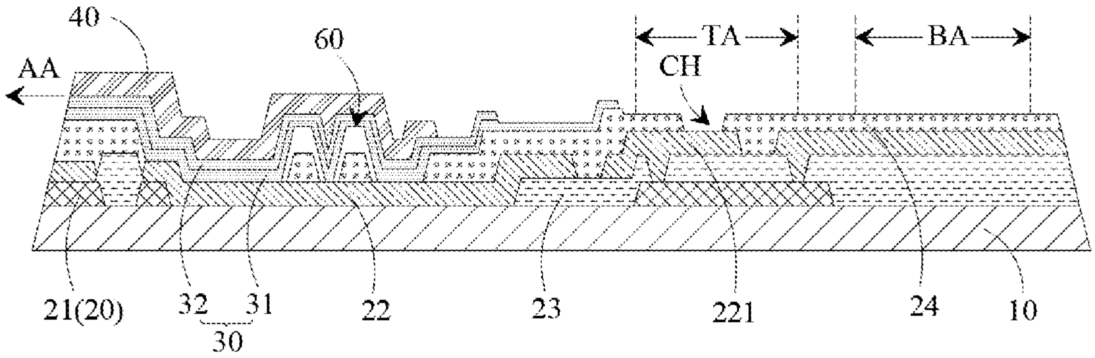

Step S36: as shown in FIG. 8*c*, removing the third photoresist pattern PR3 by using a stripping solution.

Figure 8D:
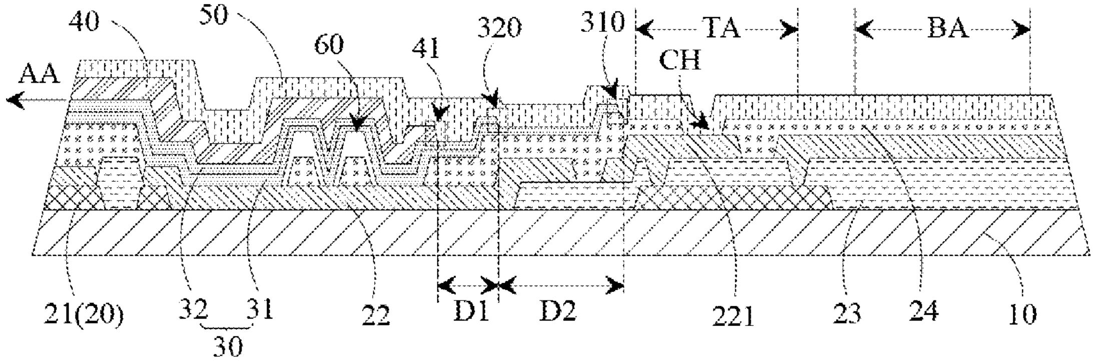

Step S40: as shown in FIG. 8*d*, forming a touch layer 50 on the inorganic layer 40 and the encapsulation layer 30, and the touch layer 50 laps with the second signal traces 221.

In the step S34, the distance between the edge of the third photoresist pattern PR3 close to the bending area BA and the second step 320 is between 20 microns and 30 microns, so that the distance D2 between the third step 310 and the second step 320 can be maintained between 20 microns and 30 microns, thereby reducing the risk that metal films inside the touch layer 50 are broken at the third step 310 or the second step 320 due to too small distance between the third step 310 and the second step 320.

In the step S35, after the etching of the first inorganic encapsulation layer 31 not covered by the third photoresist pattern PR3 is completed, it is necessary to continue to etch the exposed second planarization layer 24 exposed by etching to remove the second planarization layer 24 with a certain thickness, thereby ensuring that the first inorganic encapsulation layer 31 on the second planarization layer 24 is completely removed, avoiding the first inorganic encapsulation layer 31 remaining in the wire-switching holes CH, and ensuring that the touch layer 50 formed by subsequent deposition can pass through the wire-switching holes CH and lap with the second signal trace 221.

According to the touch panel provided in the above examples of the present disclosure, an example of the present disclosure further provides an electronic device, which may be, but is not limited to, any one of a mobile phone, a smart watch, a tablet computer, a desktop computer, and a notebook computer.

The electronic device includes a frame assembly, a power supply, a main board, a touch panel provided in the above examples, wherein the power supply and the main board may be disposed in an accommodation space of the frame assembly, and the touch panel may be disposed on the frame assembly. For a structure of the touch panel, reference may be made to a structure of the touch panel in the above examples, and details are not described herein.

Advantageous effects of examples of the present disclosure are as follows: examples of the present disclosure provide a touch panel and a method for manufacturing the same, and an electronic device. The touch panel includes a display area, a bending area disposed on one side of the display area, and a wire-switching area disposed between the display area and the bending area. The touch panel further includes a substrate, and a signal trace layer, an encapsulation layer, an inorganic layer and a touch layer which are sequentially stacked on the substrate. A signal trace is disposed in the signal trace layer. By disposing an edge of the inorganic layer close to the bending area between the barrier wall and the wire-switching area, disposing an edge of the encapsulation layer close to the bending area between an edge of the inorganic layer and the bending area, and disposing a plurality of wire-switching holes in the wire-switching area, so that signal traces are exposed by the wire-switching holes, thus preventing materials of the encapsulation layer from remaining in the wire-switching holes, ensuring that the touch layer can pass through the wire-switching holes and lap with the signal traces, reducing the width of the lower frame of the touch panel, and improving encapsulation effect of the touch panel.

In light of the foregoing, although the present application has been disclosed in preferred embodiments, the above preferred embodiments are not intended to limit the present application. Those of ordinary skill in the art may make various changes and modifications without departing from the spirit and scope of the present application, and therefore the scope of protection of the present application is based on the scope defined in the claims.

What is claimed is:

1. A touch panel comprising a display area, a bending area disposed at one side of the display area, and a wire-switching area disposed between the display area and the bending area, wherein the touch panel further comprises a substrate, and a signal trace layer, an encapsulation layer, an inorganic layer and a touch layer that are sequentially stacked on the substrate, a signal trace is disposed in the signal trace layer, at least one barrier wall is disposed between the signal trace layer and the encapsulation layer, and the barrier wall is located between the display area and the wire-switching area;

wherein an edge of the inorganic layer close to the bending area is disposed between the barrier wall and the wire-switching area, an edge of the encapsulation layer close to the bending area is disposed between the edge of the inorganic layer close to the bending area and the bending area, more than one wire-switching hole is disposed in the wire-switching area to expose the signal trace, and the touch layer passes through the wire-switching holes and laps with the signal trace.

2. The touch panel according to claim 1, wherein the encapsulation layer is disposed in the wire-switching area, and the signal trace is exposed from the encapsulation layer.

3. The touch panel according to claim 2, wherein the signal trace layer comprises a planarization layer disposed on one side of the signal trace layer away from the substrate, and the encapsulation layer is disposed on one side of the planarization layer away from the substrate; and wherein the wire-switching hole comprises a first opening penetrating through the planarization layer and a second opening penetrating through the encapsulation layer, and the second opening is connected to the first opening.

4. The touch panel according to claim 3, wherein an orthographic projection of the second opening on the substrate falls within an orthographic projection of the first opening on the substrate.

5. The touch panel according to claim 3, wherein the encapsulation layer covers sidewalls of the first opening.

6. The touch panel according to claim 3, wherein the encapsulation layer comprises a first inorganic encapsulation layer and a second inorganic encapsulation layer disposed on the first inorganic encapsulation layer;

wherein an edge of the second inorganic encapsulation layer close to the wire-switching area is disposed between the edge of the inorganic layer close to the wire-switching area and the wire-switching area, an edge of the first inorganic encapsulation layer close to the bending area is disposed between the wire-switching area and the bending area, and the second opening penetrates through the first inorganic encapsulation layer.

7. The display module according to claim 6, wherein the first inorganic encapsulation layer and the second inorganic encapsulation layer overlap in the display area and an area between the display area and the edge of the second inorganic encapsulation layer close to the wire-switching area, and the first inorganic encapsulation layer and the second inorganic encapsulation layer do not overlap in an area between the edge of the second inorganic encapsulation layer close to the wire-switching area and the edge of the first inorganic encapsulation layer close to the bending area; and wherein a thickness of the first inorganic encapsulation layer overlapping with the second inorganic encapsulation layer is greater than a thickness of the first inorganic encapsulation layer not overlapping with the second inorganic encapsulation layer.

8. The touch panel according to claim 6, wherein the edge of the inorganic layer close to the wire-switching area is formed with a first step protruding on a surface of the second inorganic encapsulation layer, and the edge of the second inorganic encapsulation layer close to the wire-switching area is formed with a second step protruding on a surface of the first inorganic encapsulation layer; and wherein the first step is disposed between the barrier wall and the wire-switching area, the second step is disposed between the first step and the wire-switching area, and a distance between the second step and the first step is greater than or equal to 20 microns and less than or equal to 30 microns.

9. The touch panel according to claim 1, wherein the signal trace layer comprises a planarization layer disposed on one side of the signal trace layer away from the substrate, and the encapsulation layer is disposed on one side of the planarization layer away from the substrate; and wherein the wire-switching hole penetrates through the planarization layer, and the edge of the encapsulation layer close to the wire-switching area is disposed between the edge of the inorganic layer close to the wire-switching area and the wire-switching area.

10. The touch panel according to claim 9, wherein the encapsulation layer comprises a first inorganic encapsulation layer and a second inorganic encapsulation layer disposed on the first inorganic encapsulation layer; and wherein an edge of the second inorganic encapsulation layer close to the wire-switching area is disposed between the edge of the inorganic layer close to the wire-switching area and the wire-switching area, and an edge of the first inorganic encapsulation layer close to the wire-switching area is disposed between the edge of the second inorganic encapsulation layer close to the wire-switching area and the wire-switching area.

11. The touch panel according to claim 10, wherein the first inorganic encapsulation layer and the second inorganic encapsulation layer overlap in the display area and an area between the display area and the edge of the second inorganic encapsulation layer close to the wire-switching area, and the first inorganic encapsulation layer and the second inorganic encapsulation layer do not overlap in an area between the edge of the second inorganic encapsulation layer close to the wire-switching area and the edge of the first inorganic encapsulation layer close to the wire-switching area; and wherein a thickness of the first inorganic encapsulation layer overlapping with the second inorganic encapsulation layer is greater than a thickness of the first inorganic encapsulation layer not overlapping with the second inorganic encapsulation layer.

12. The touch panel according to claim 10, wherein the edge of the inorganic layer close to the wire-switching area is formed with a first step protruding on a surface of the second inorganic encapsulation layer, the edge of the second inorganic encapsulation layer close to the wire-switching area is formed with a second step protruding on a surface of the first inorganic encapsulation layer, and the edge of the first inorganic encapsulation layer close to the bending area is formed with a third step protruding on a surface of the planarization layer; and wherein the first step is disposed between the barrier wall and the wire-switching area, the second step is disposed between the first step and the wire-switching area, the third step is disposed between the second step and the third step, a distance between the second step and the first step is greater than or equal to 20 microns and less than or equal to 30 microns, and a distance between the third step and the second step is greater than or equal to 20 microns and less than or equal to 30 microns.

13. A method for manufacturing a touch panel, wherein the touch panel comprises a display area, a bending area disposed at one side of the display area, and a wire-switching area disposed between the display area and the bending area, and the method comprises:

sequentially forming a signal trace layer, at least one barrier wall, an encapsulation layer and an inorganic layer on a substrate, both the encapsulation layer and the inorganic layer covering the display area, the wire-switching area and the bending area, and the barrier wall being formed between the display area and the wire-switching area;

etching the inorganic layer so that an edge of the inorganic layer close to the wire-switching area is retracted between the barrier wall and the wire-switching area;

etching the encapsulation layer so that an edge of the encapsulation layer close to the bending area is retracted between an edge of the inorganic layer and the bending area to expose a signal trace in the signal trace layer; and forming a touch layer on the inorganic layer and the encapsulation layer, and the touch layer being lapping with the signal trace.

14. An electronic device comprising a touch panel, wherein the touch panel comprises a display area, a bending area disposed on one side of the display area, and a wire-switching area disposed between the display area and the bending area, and the touch panel further comprises a substrate, a signal trace layer, an encapsulation layer, an inorganic layer and a touch layer that are sequentially stacked on the substrate, wherein a signal trace is disposed in the signal trace layer, at least one barrier wall is disposed between the signal trace layer and the encapsulation layer, and the barrier wall is located between the display area and the wire-switching area; and wherein an edge of the inorganic layer close to the bending area is disposed between the barrier wall and the wire-switching area, an edge of the encapsulation layer close to the bending area is disposed between the edge of the inorganic layer close to the bending area and the bending area, more than one wire-switching hole is disposed in the wire-switching area to expose the signal trace, and the touch layer passes through the wire-switching holes and laps with the signal trace.

15. The electronic device according to claim 14, wherein the encapsulation layer is disposed in the wire-switching area, and the signal trace is exposed from the encapsulation layer.

16. The electronic device according to claim 15, wherein the signal trace layer comprises a planarization layer disposed on one side of the signal trace layer away from the substrate, and the encapsulation layer is disposed on one side of the planarization layer away from the substrate; and wherein the wire-switching hole comprises a first opening penetrating through the planarization layer and a second opening penetrating through the encapsulation layer, and the second opening is connected to the first opening.

17. The electronic device according to claim 16, wherein an orthographic projection of the second opening on the substrate falls within an orthographic projection of the first opening on the substrate.

18. The electronic device according to claim 16, wherein the encapsulation layer covers sidewalls of the first opening.

19. The electronic device according to claim 16, wherein the encapsulation layer comprises a first inorganic encapsulation layer and a second inorganic encapsulation layer disposed on the first inorganic encapsulation layer;

wherein an edge of the second inorganic encapsulation layer close to the wire-switching area is disposed between the edge of the inorganic layer close to the wire-switching area and the wire-switching area, an edge of the first inorganic encapsulation layer close to the bending area is disposed between the wire-switching area and the bending area, and the second opening penetrates through the first inorganic encapsulation layer.

20. The electronic device according to claim 19, wherein the first inorganic encapsulation layer and the second inorganic encapsulation layer overlap in the display area and an area between the display area and the edge of the second inorganic encapsulation layer close to the wire-switching area, and the first inorganic encapsulation layer and the second inorganic encapsulation layer do not overlap in an area between the edge of the second inorganic encapsulation layer close to the wire-switching area and the edge of the first inorganic encapsulation layer close to the bending area; and wherein a thickness of the first inorganic encapsulation layer overlapping with the second inorganic encapsulation layer is greater than a thickness of the first inorganic encapsulation layer not overlapping with the second inorganic encapsulation layer.

* * * * *